United States Patent
Jiang et al.

(10) Patent No.: US 9,531,095 B1
(45) Date of Patent: Dec. 27, 2016

(54) COMMUNICATION STRUCTURE WITH CONNECTING ASSEMBLY

(71) Applicant: VIEWMOVE TECHNOLOGIES, INC., Pingzhen (TW)

(72) Inventors: Shyh-Biau Jiang, Pingzhen (TW);
Li-Yeh Liu, Pingzhen (TW);
Dong-Liang Lee, Pingzhen (TW);
Chuan-Fu Huang, Pingzhen (TW);
Yun-Sheng Hsiao, Pingzhen (TW)

(73) Assignee: VIEWMOVE TECHNOLOGIES, INC., Pingzhen (TW)

( * ) Notice: Subject to any disclaimer, the term of this patent is extended or adjusted under 35 U.S.C. 154(b) by 0 days.

(21) Appl. No.: 15/072,880

(22) Filed: Mar. 17, 2016

(30) Foreign Application Priority Data

Dec. 21, 2015 (TW) .............................. 104143018 A

(51) Int. Cl.
*H01R 12/71* (2011.01)
*H01R 13/506* (2006.01)
*H01R 13/514* (2006.01)

(52) U.S. Cl.
CPC .......... *H01R 12/712* (2013.01); *H01R 13/506* (2013.01); *H01R 13/514* (2013.01)

(58) Field of Classification Search
CPC ............. H01R 4/64; H01R 9/26; H01R 9/096; H01R 12/52; H01R 12/712; H01R 12/716; H01R 12/523; H01R 13/506; H01R 13/514
USPC .................. 439/78, 65, 74, 75, 94, 532, 716
See application file for complete search history.

(56) References Cited

U.S. PATENT DOCUMENTS

| | | | | |
|---|---|---|---|---|
| 4,641,426 A | * | 2/1987 | Hartman | H01R 9/091 228/180.1 |
| 4,693,532 A | * | 9/1987 | Colleran | H01R 4/2445 439/405 |
| 5,863,211 A | * | 1/1999 | Sobotta | G06F 1/184 361/735 |
| 5,887,623 A | * | 3/1999 | Nagai | F04F 5/48 137/884 |
| 6,173,731 B1 | * | 1/2001 | Ottliczky | F15B 13/0817 137/271 |

(Continued)

FOREIGN PATENT DOCUMENTS

| | | |
|---|---|---|
| CN | 1979959 A | 6/2007 |
| TW | M346169 U | 12/2008 |

(Continued)

OTHER PUBLICATIONS

Office Action issued in corresponding Taiwanese Application No. 104143018 dated Aug. 14, 2016 (6 pages).

*Primary Examiner* — Tulsidas C Patel
*Assistant Examiner* — Travis Chambers
(74) *Attorney, Agent, or Firm* — Osha Liang LLP

(57) ABSTRACT

A communication structure with connecting assembly is described. The communication structure comprises a housing base, a circuit board, a connecting assembly and a cover body wherein the connecting assembly comprises a plurality of conducting terminals, an adapting board coupled to the conducting terminals, and a first connecting socket coupled to the adapting board. The communication structure stably and electrically connected to another communication structure by the connecting assembly and at least two communication structures are electrically connected together to construct a communication system for conveniently expending more communication nodes.

11 Claims, 3 Drawing Sheets

(56) References Cited

U.S. PATENT DOCUMENTS

| | | | | |
|---|---|---|---|---|
| 6,213,153 B1* | 4/2001 | Hayashi | ............... | F15B 13/0817 |
| | | | | 137/560 |
| 6,382,257 B2* | 5/2002 | Mead | .................. | F15B 13/0839 |
| | | | | 137/870 |
| 6,475,036 B2* | 11/2002 | Morikawa | .......... | H01R 13/6395 |
| | | | | 439/716 |
| 6,634,910 B2* | 10/2003 | Lieb | ..................... | H05K 7/1465 |
| | | | | 439/271 |
| 8,256,456 B2* | 9/2012 | De Carolis | ......... | F15B 13/0857 |
| | | | | 137/560 |
| 8,545,237 B2* | 10/2013 | Johnson | ............... | H01R 12/523 |
| | | | | 439/75 |
| 2007/0238359 A1 | 10/2007 | Gutierrez et al. | | |
| 2013/0102203 A1 | 4/2013 | O'Malley et al. | | |
| 2013/0155634 A1 | 6/2013 | Jiang et al. | | |

FOREIGN PATENT DOCUMENTS

| | | |
|---|---|---|
| TW | 201145728 A | 12/2011 |
| TW | 201328085 A | 7/2013 |
| TW | M476401 | 4/2014 |

* cited by examiner

COMMUNICATION STRUCTURE WITH CONNECTING ASSEMBLY

BACKGROUND OF THE INVENTION

Field of Invention

The present invention relates to a communication structure, and more particularly to a communication structure with a connecting assembly.

Description of Prior Art

Conventionally, due to the increased demand for product manufacturing process, an automation technology is widely used in a production process and the automation technology usually employs a plurality of serially connected input/output (I/O) modules to transmit a packet serial having data packets wherein a master/slave structure is used to transmit and process the packet serial with the data packets, which are forwarded to the I/O modules, by a serial bus interface protocol. Specifically, when a plurality of I/O modules are serially connected to form a communication system, the I/O modules are electrically connected by elastic contacts each other. However, the contact statuses between the elastic contacts of the I/O modules cannot exactly and stably form electrical connections so that the data transmission signals between the I/O modules will be lost.

Furthermore, when more and more I/O modules in a module group are used to construct the communication system to expand the operation nodes of the communication system, redundant nodes in the expanded I/O module will not be used, which increases manufacturing cost. For example, the communication system is composed of two module groups wherein each module group has sixteen I/O modules each. If there is a need to expand the communication system from thirty-two I/O modules to thirty-three I/O modules, it is required to add an additional module group with the sixteen I/O modules to the original two module groups to form three module groups with forty-eight I/O modules, which generates fifteen redundant I/O modules to increase the manufacturing cost of the communication system. Consequently, there is a need to develop a communication system to solve the aforementioned problems.

SUMMARY OF THE INVENTION

One objective of the present invention is to provide a communication structure with a connecting assembly so that the communication structure stably and electrically connected to another communication structure by using the connecting assembly and at least two communication structures are electrically connected together to construct a communication system for conveniently expanding more communication nodes.

According to the above objective, the present invention sets forth communication structure with a connecting assembly. The communication structure with a connecting assembly comprises: a housing base comprising a containing bottom portion, a first opening formed on the containing bottom portion, and at least one sidewall disposed around the edge portion of the containing bottom portion; a circuit board fastened to the containing bottom portion, wherein the circuit board comprises a plurality of first terminal holes and a plurality of second terminal holes, and the first terminal holes align to the first opening of the housing base; the connecting assembly fastened to the surface of the circuit board, comprising: a plurality of first conducting terminals, wherein two end portions of each first conducting terminal respectively comprises a first soldering portion and a second soldering portion, and the first soldering portions of the first conducting terminals are correspondingly and electrically soldered with the conductive sidewalls of the second terminal holes of the circuit board; an adapting board comprising a plurality of third terminal holes and a plurality of fourth terminal holes, wherein the second soldering portions of the first conducting terminals are correspondingly and electrically soldered with the third terminal holes, and the third terminal holes are electrically connected to the fourth terminal holes in the adapting board; and a first connecting socket comprising a plurality of first conducting portions and a plurality of first conducting bores electrically connected to the first conducting portions correspondingly, wherein the first conducting portions electrically are connected to the fourth terminal holes of the adapting board correspondingly; and a cover unit comprising a surface portion opposite to the containing bottom portion of the housing base, and a second opening formed on the surface portion, wherein the first connecting socket of the connecting assembly is aligned to the second opening of the cover unit.

In one embodiment, the connecting assembly further comprises a second connecting socket having a plurality of second conducting portions and a plurality of second conducting bores electrically connected to the second conducting portions correspondingly.

In one embodiment, the first conducting bores of the first connecting socket and the second conducting bores of the second connecting socket have the same bore pitch.

In one embodiment, the first connecting socket is aligned to the second connecting socket.

In one embodiment, the first conducting terminals are arranged in two parallel rows.

In one embodiment, the sidewall of the housing base comprises a plurality of retaining holes.

In one embodiment, the cover unit comprises a plurality of retaining posts to be inserted to the retaining holes for securing the cover unit to the housing base.

In one embodiment, the housing base further comprises a pair of buckling portions disposed on the sidewall for fastening the pair of buckling portions to a pair of hook portions correspondingly to connect one communication structure to another communication structure.

In one embodiment, the second terminal holes of the circuit board are electrically connected to the output ends of a processing circuit unit of the circuit board.

In one embodiment, the communication structure with the connecting assembly further comprises a clasping member disposed on the containing bottom portion of the housing base for fastening the communication structure to a rail unit.

In one embodiment, the clasping member comprises a resilient portion with a protrusion portion in a free end of the resilient portion to clasp the communication structure to the rail unit.

DETAILED DESCRIPTION OF THE PREFERRED EMBODIMENTS

Figure 1:
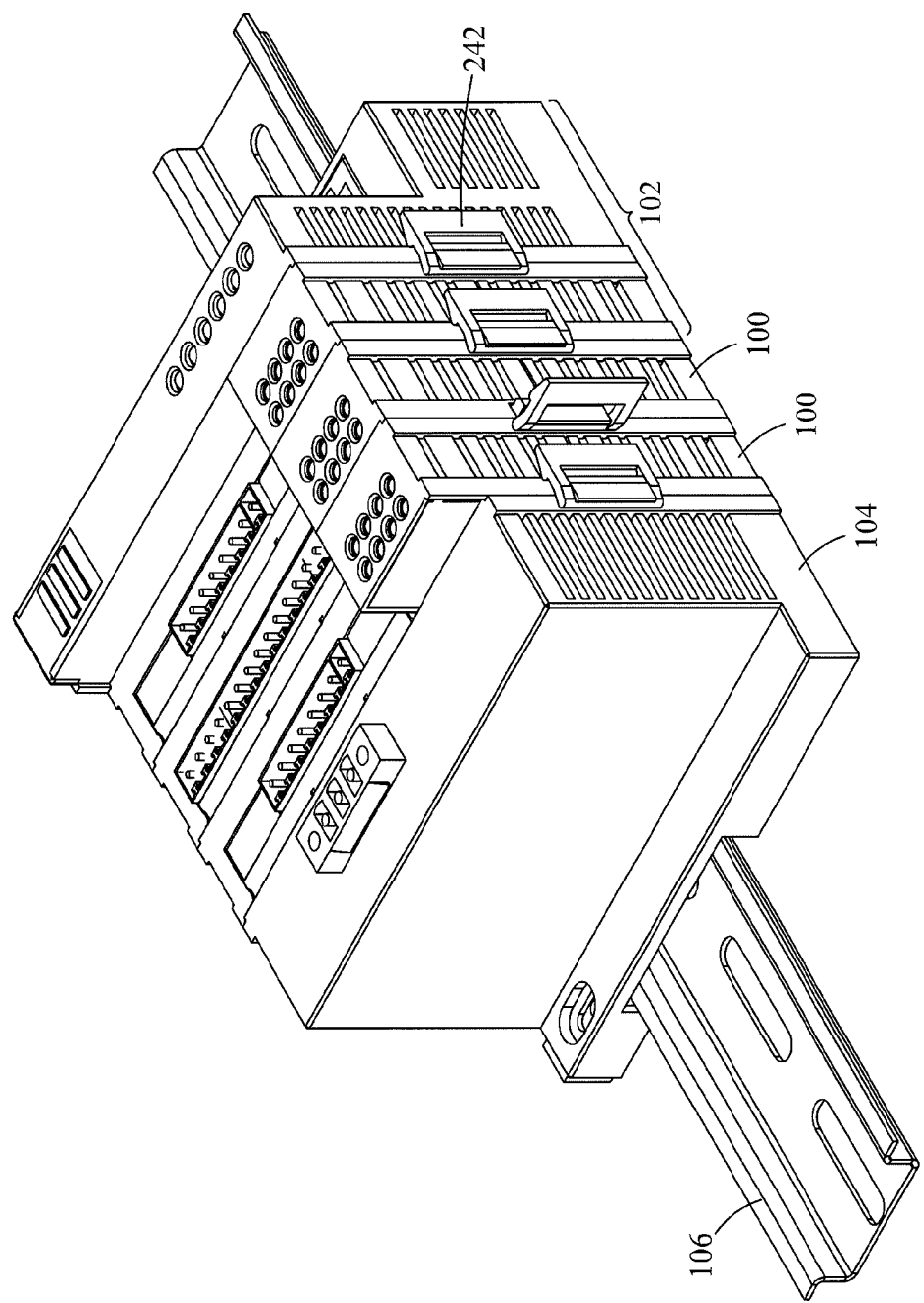
FIG. 1 is a schematic three-dimensional view of a communication system with a connecting assembly according to one embodiment of the present invention.

Referring to FIG. 1, which is a schematic three-dimensional view of a communication system with a connecting assembly 204 according to one embodiment of the present invention. The communication system comprises at least one communication structure 100, a coupling device 102 and a terminal device 104. The at least one communication structure 100 is connected to the coupling device 102 to the terminal device 104 wherein the at least one communication structure 100 is disposed between the coupling device 102 and the terminal device 104. The at least one communication structure 100, e.g. two communication structures 100, a coupling device 102 and a terminal device 104 are fastened to a rail unit 106. The coupling device 102 is used to transmit a first instruction packet string, e.g. an instruction packet serial, to the at least one communication structure 100 wherein the first instruction packet string comprises a plurality of instruction packets. The at least one communication structure 100 receives the first instruction packet string along a first path. The terminal device 104 receives a plurality of first response packets and a second instruction packet string along the second path which are composed of non-corresponding instruction packets of the at least one communication structure 100. Furthermore, the second instruction packet string is sequentially sent back to the coupling device 102 via the at least one communication structure 100 along a second path serially connected to the first path.

Figure 2:
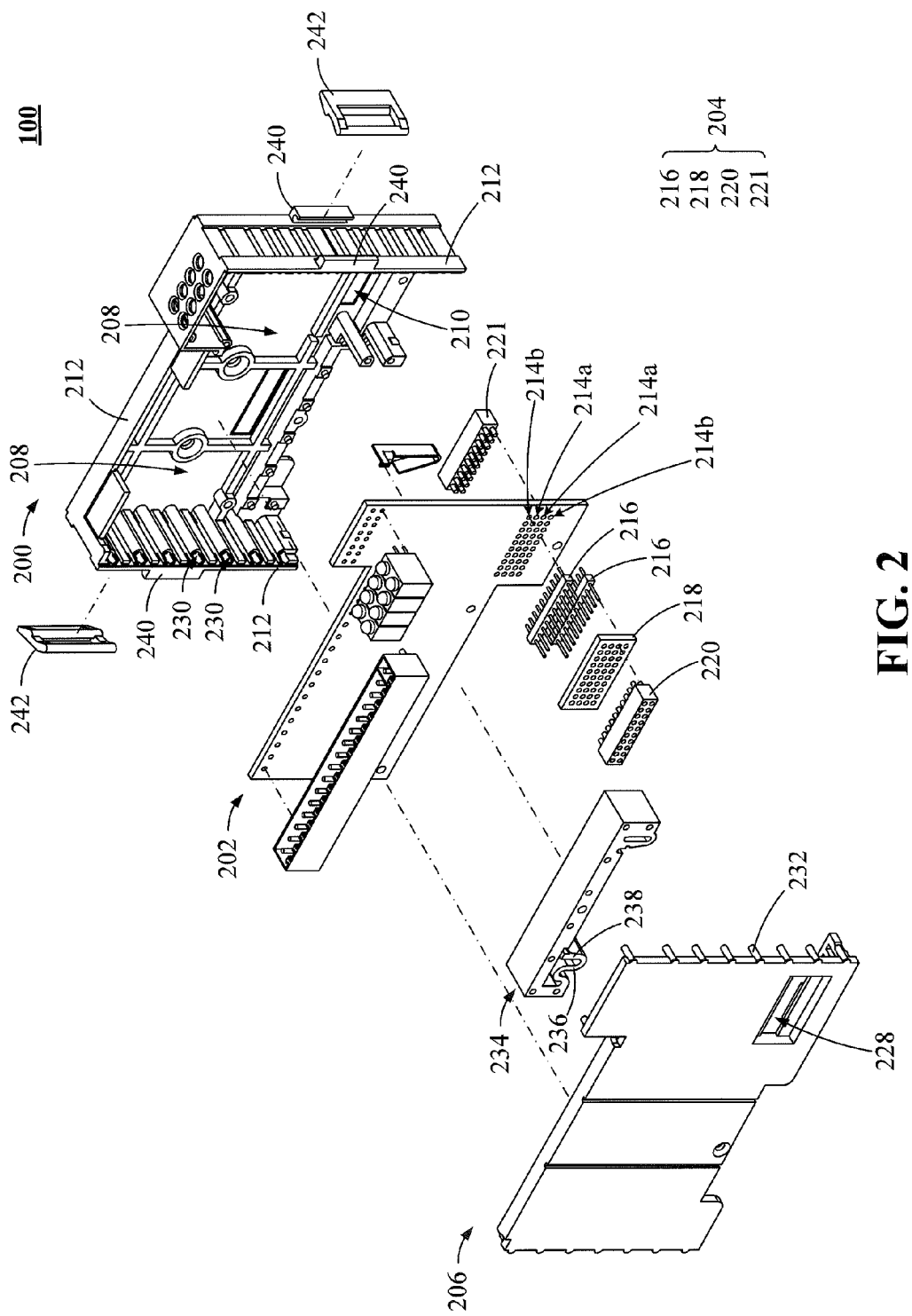
FIG. 2 is a schematic three-dimensional exploded view of a communication structure with the connecting assembly shown in FIG. 1 according to one embodiment of the present invention.

Referring to FIG. 2, which is a schematic three-dimensional exploded view of a communication structure 100 with the connecting assembly 204 shown in FIG. 1 according to one embodiment of the present invention. The communication structure 100 with the connecting assembly 204 comprises a housing base 200, a circuit board 202 and cover unit 206. The housing base 200 contains the circuit board 202 to support the circuit board 202 and the cover unit 206 is covered with the housing base 200 to form the communication structure 100. The connecting assembly 204 is capable of connecting one communication structure 100 to another communication structure 100 wherein the connecting assembly 204 serves as the functions of electrical signal coupling and structural component connection so that the structural connections between the communication structures 100 are stably formed to correctly transmits the signals which includes the data signals and the power signals generated by the circuit board 202 within the communication system.

In the communication structure 100 with the connecting assembly 204 of FIG. 2, the housing base 200 comprises a containing bottom portion 208, a first opening 210 formed on the containing bottom portion 208, and at least one sidewall 212 disposed around the edge portion of the containing bottom portion 208. The containing bottom portion 208 is used to support the circuit board 202 and the connecting assembly 204 electrically connected to the circuit board 202 is exposed from the first opening 210. For example, the circuit board 202 is fastened to the containing bottom portion 208 of the housing base 200 or buckled to the containing bottom portion 208. In one embodiment, the at least one sidewall 212 is disposed around the edge portion of the containing bottom portion 208 for surrounding the circuit board 202. For example, the sidewall 212 comprises a plurality of slots for ventilation and heat dissipation while the circuit board 202 is operated.

In FIG. 2, the circuit board 202 is fastened to the containing bottom portion 208, wherein the circuit board 202 comprises a plurality of first terminal holes 214a and a plurality of second terminal holes 214b and the first terminal holes 214a align to the first opening 210 of the housing base 200 such that the first terminal holes 214a are disposed within the first opening 210. In one case, the first terminal holes 214a and second terminal holes 214b are formed through the circuit board 202. In one embodiment, the profile of the circuit board 202 is suitable for the region of the containing bottom portion 208. The conductive sidewall (not shown) of the first terminal holes 214a and second terminal holes 214b respectively are electrically connected to the circuit board 202 via interconnection lines (not shown). For example, the first terminal holes 214a corresponding to the input side of the current communication structure 100 receives the signal from the prior communication structure 100 and sends the received signal of the prior communication structure 100 to the current communication structure 100 for processing. The second terminal holes 214b then transmits the processed signal to the next communication structure 100 via the connecting assembly 204.

Figure 3:
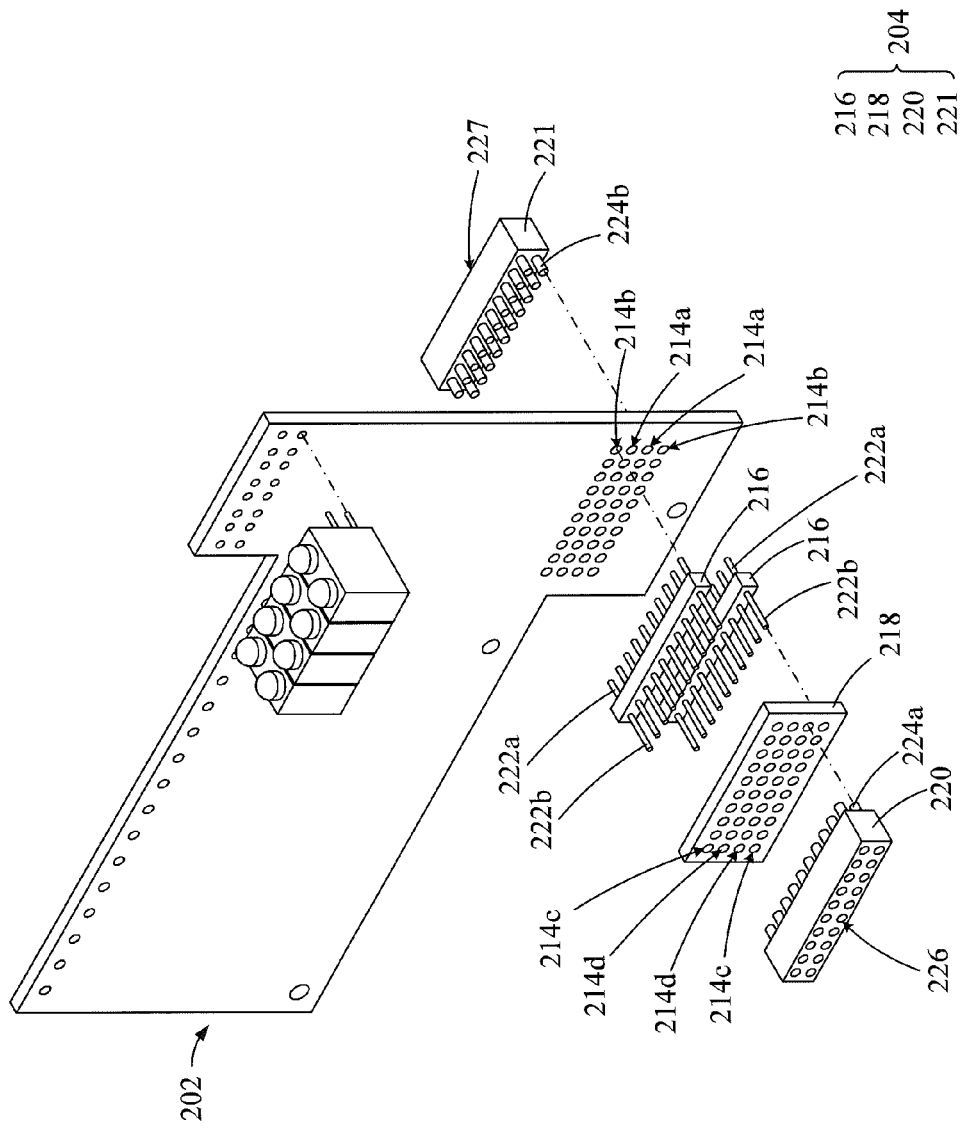
FIG. 3 is a partially schematic enlarged and exploded three-dimensional view of the connecting assembly shown in FIG. 2 according to one embodiment of the present invention.

Please refer to FIG. 2 and FIG. 3. FIG. 3 is a partially schematic enlarged and exploded three-dimensional view of the connecting assembly 204 shown in FIG. 2 according to one embodiment of the present invention. The connecting assembly 204 is fastened to the surface of the circuit board 202 for electrically connecting the second terminal holes 214b of the circuit board 202. The connecting assembly 204 comprises a plurality of first conducting terminals 216, an adapting board 218 and a first connecting socket 220. The first conducting terminals 216, the adapting board 218 and the first connecting socket 220 are serially connected in the output side of the circuit board 202 for transferring the processed signals in the current communication structure 100 to the next communication structure 100. The conductive sidewall (not shown) of the second terminal holes 214b of the circuit board 202 are electrically connected to a processing circuit unit of the circuit board 202 via interconnection lines (not shown).

As shown in FIG. 2 and FIG. 3, two end portions of each first conducting terminal 216 respectively comprise a first soldering portion 222a and a second soldering portion 222b. The first soldering portions 222a of the first conducting terminals 216 are correspondingly and electrically soldered with the conductive sidewall of the second terminal holes 214b of the circuit board 202. In other words, the first conducting terminals 216 connect the first soldering portions 222a to the second terminal holes 214b correspondingly so that the signal transmission positions of the second terminal holes 214b for the data signal corresponding to the circuit board 202 in the current communication structure 100 can be configured properly. In one embodiment, the first conducting terminals 216 are arranged in two parallel rows.

In FIG. 2 and FIG. 3, the adapting board 218 comprises a plurality of third terminal holes 214c and a plurality of fourth terminal holes 214d wherein the second soldering portions 222b of the first conducting terminals 216 are correspondingly and electrically soldered with the conductive sidewalls of the third terminal holes 214c and the third terminal holes 214c are electrically connected to the fourth terminal holes 214d in the adapting board 218. Specifically, the third terminal holes 214c of the adapting board 218 receive the data signals from the first conducting terminals 216. The fourth terminal holes 214d re-direct to the third terminal holes 214c so that the fourth terminal holes 214d of the adapting board 218 align to the first terminal holes 214a of the circuit board 202. Therefore, the connecting assembly 204 makes an alignment of the current communication structure 100 between the prior communication structure 100 and next communication structure 100 for easily expanding the nodes of the communication structures 100. The connecting assembly 204 between the circuit board 202 and cover unit 206 make a stable electrical connection to the communication structure 100. In one embodiment, when the prior communication structure 100 is connected to the current communication structure 100, the connecting assembly 204 is capable of supporting the prior communication structure 100 and the current communication structure 100 via the circuit board 202.

As shown in FIG. 2 and FIG. 3, the first connecting socket 220 comprises a plurality of first conducting portions 224a and a plurality of first conducting bores 226 electrically connected to the first conducting portions 224a correspondingly, wherein the first conducting portions 224a are electrically connected to the fourth terminal holes 214d of the adapting board 218 correspondingly. The first connecting socket 220 of the connecting assembly 204 is a connection interface between the current communication structure 100 and the next communication structure 100. In one embodiment, the first conducting portions 224a of the first connecting socket 220 are stably and electrically connected to the first conducting bores 226 correspondingly so that the first conducting bores 226 transfers the data signals of the current communication structure 100 to the next communication structure 100.

As shown in FIG. 2 and FIG. 3, the connecting assembly 204 further comprises a second connecting socket 221 having a plurality of second conducting portions 224b and a plurality of second conducting bores 227 electrically connected to the second conducting portions 224b correspondingly. In one embodiment, the first conducting bores 226 of the first connecting socket 220 and the second conducting bores 227 of the second connecting socket 221 have the same bore pitch. The first connecting socket 220 is aligned to the second connecting socket 221 so that the second connecting socket 221 is electrically connected to the prior communication structure 100 and the first connecting socket 220 is electrically connected to the next communication structure 100.

As shown in FIG. 2, the cover unit 206 comprises a surface portion opposite the containing bottom portion 208 of the housing base 200, and a second opening 228 formed on the surface portion, wherein the first connecting socket 220 of the connecting assembly 204 is aligned to the second opening 228 of the cover unit 206. In one embodiment, the sidewall 212 of the housing base 200 comprises a plurality of retaining holes 230. The cover unit 206 comprises a plurality of retaining posts 232 to be inserted to the retaining holes 230 correspondingly for securing the cover unit 206 to the housing base 200.

Continuously referring to FIG. 2, the communication structure 100 with the connecting assembly 204 further comprises a clasping member 234 disposed on the containing bottom portion 208 of the housing base 200 for fastening the communication structure 100 to a rail unit 106. The clasping member 234 comprises a resilient portion 236 with a protrusion portion 238 in a free end of the resilient portion 236 to clasp the communication structure 100 to the rail unit 106. The housing base 200 in the communication structure 100 with the connecting assembly 204 further comprises a pair of buckling portions 240 disposed on the sidewall 212 for fastening the pair of buckling portions 240 to a pair of hook portions 242 correspondingly to connect one communication structure 100 to another communication structure 100.

According to the above-mentioned descriptions, the present invention employs a communication structure with a connecting assembly so that the communication structure stably and electrically connected to another communication structure by using the connecting assembly and a plurality of communication structures are electrically connected together to construct a communication system for conveniently expanding more communication nodes, e.g. communication structures.

As is understood by a person skilled in the art, the foregoing preferred embodiments of the present invention are illustrative rather than limiting of the present invention. It is intended that they cover various modifications and similar arrangements be included within the spirit and scope of the present invention, the scope of which should be accorded the broadest interpretation so as to encompass all such modifications and similar structure.

What is claimed is:
1. A communication structure with a connecting assembly, comprising:
    a housing base comprising a containing bottom portion, a first opening formed on the containing bottom portion, and at least one sidewall disposed around the edge portion of the containing bottom portion;
    a circuit board fastened to the containing bottom portion, wherein the circuit board comprises a plurality of first terminal holes and a plurality of second terminal holes, and the first terminal holes align to the first opening of the housing base;
    the connecting assembly fastened to a surface of the circuit board, the connecting assembly comprising:
        a plurality of first conducting terminals, wherein two end portions of each first conducting terminal respectively comprises a first soldering portion and a second soldering portion, and the first soldering portions of the first conducting terminals are correspondingly and electrically soldered with conductive sidewalls of the second terminal holes of the circuit board;
        an adapting board comprising a plurality of third terminal holes and a plurality of fourth terminal holes, wherein the second soldering portions of the first conducting terminals are correspondingly and electrically soldered with the third terminal holes, and the third terminal holes are electrically connected to the fourth terminal holes in the adapting board; and
        a first connecting socket comprising a plurality of first conducting portions and a plurality of first conducting bores electrically connected to the first conducting portions correspondingly, wherein the first conducting portions electrically are connected to the fourth terminal holes of the adapting board correspondingly; and
    a cover unit comprising a surface portion opposite the containing bottom portion of the housing base, and a second opening formed on the surface portion, wherein the first connecting socket of the connecting assembly is aligned to the second opening of the cover unit.

2. The communication structure with the connecting assembly of claim 1, wherein the first conducting terminals are arranged in two parallel rows.

3. The communication structure with the connecting assembly of claim 1, wherein the housing base further comprises a pair of buckling portions disposed on the sidewall for fastening the pair of buckling portions to a pair of hook portions correspondingly to connect one communication structure to another communication structure.

4. The communication structure with the connecting assembly of claim 1, wherein the second terminal holes of the circuit board are electrically connected to a processing circuit unit of the circuit board.

5. The communication structure with the connecting assembly of claim 1, wherein the connecting assembly further comprises a second connecting socket having a plurality of second conducting portions and a plurality of second conducting bores electrically connected to the second conducting portions correspondingly.

6. The communication structure with the connecting assembly of claim 5, wherein the first conducting bores of the first connecting socket and the second conducting bores of the second connecting socket have a same bore pitch.

7. The communication structure with the connecting assembly of claim 5, wherein the first connecting socket is aligned to the second connecting socket.

8. The communication structure with the connecting assembly of claim 1, wherein the sidewall of the housing base comprises a plurality of retaining holes.

9. The communication structure with the connecting assembly of claim 8, wherein the cover unit comprises a plurality of retaining posts to be inserted to the retaining holes for securing the cover unit to the housing base.

10. The communication structure with the connecting assembly of claim 1, further comprising a clasping member disposed on the containing bottom portion of the housing base for fastening the communication structure to a rail unit.

11. The communication structure with the connecting assembly of claim 10, wherein the clasping member comprises a resilient portion with a protrusion portion in a free end of the resilient portion to clasp the communication structure to the rail unit.

* * * * *